(12) United States Patent
O'Neill et al.

(10) Patent No.: US 9,716,229 B2
(45) Date of Patent: Jul. 25, 2017

(54) POLYMER NETWORKS

(75) Inventors: Mary O'Neill, Hull (GB); Stephen Malcolm Kelly, Beverley (GB); Stuart Paul Kitney, Beverly (GB)

(73) Assignee: UNIVERSITY OF HULL, Hull, Humberside (GB)

( * ) Notice: Subject to any disclaimer, the term of this patent is extended or adjusted under 35 U.S.C. 154(b) by 875 days.

(21) Appl. No.: 13/979,015

(22) PCT Filed: Jan. 20, 2012

(86) PCT No.: PCT/GB2012/050126
§ 371 (c)(1),
(2), (4) Date: Jul. 10, 2013

(87) PCT Pub. No.: WO2012/098410
PCT Pub. Date: Jul. 26, 2012

(65) Prior Publication Data
US 2013/0299805 A1 Nov. 14, 2013

(30) Foreign Application Priority Data
Jan. 21, 2011 (GB) .................................. 1101094.9

(51) Int. Cl.
| | | |
|---|---|---|
| *H01L 51/50* | (2006.01) | |
| *H01L 51/00* | (2006.01) | |
| *C09K 11/06* | (2006.01) | |
| *C09K 19/32* | (2006.01) | |
| *C09K 19/34* | (2006.01) | |
| *C09K 19/60* | (2006.01) | |
| *H05B 33/10* | (2006.01) | |
| *C09K 19/04* | (2006.01) | |

(52) U.S. Cl.
CPC .......... *H01L 51/0036* (2013.01); *C09K 11/06* (2013.01); *C09K 19/32* (2013.01); *C09K 19/3491* (2013.01); *C09K 19/60* (2013.01); *H01L 51/0002* (2013.01); *H05B 33/10* (2013.01); *C09K 2019/0448* (2013.01); *C09K 2211/1416* (2013.01); *C09K 2211/1425* (2013.01); *C09K 2211/1458* (2013.01)

(58) Field of Classification Search
None
See application file for complete search history.

(56) References Cited

U.S. PATENT DOCUMENTS

| | | |
|---|---|---|
| 2003/0119936 A1 | 6/2003 | O'Neill et al. |
| 2005/0004251 A1 | 1/2005 | O'Neill et al. |
| 2005/0116199 A1 | 6/2005 | Kelly et al. |
| 2005/0238913 A1* | 10/2005 | Kelly ............. C09B 57/00 428/690 |
| 2007/0194277 A1 | 8/2007 | O'Neill et al. |
| 2007/0197737 A1 | 8/2007 | Alfred et al. |
| 2008/0267571 A1* | 10/2008 | Zheng ............. G02F 1/065 385/123 |
| 2010/0045171 A1 | 2/2010 | Katakura et al. |
| 2013/0037752 A1 | 2/2013 | Koch |

FOREIGN PATENT DOCUMENTS

| | | |
|---|---|---|
| WO | 2005010123 A1 | 2/2005 |
| WO | 2005034184 A2 | 4/2005 |
| WO | WO 2005/060471 A2 | 7/2005 |
| WO | WO 2005/095543 A2 | 10/2005 |
| WO | WO 2006/058182 A2 | 6/2006 |
| WO | 2007064721 A2 | 6/2007 |
| WO | 2010151610 A2 | 12/2010 |

OTHER PUBLICATIONS

Yamaguchi, A, et al., "Odd-Even Effects in the Phase Transition Behaviour of Novel U-Shaped Liquid Crystals", Liquid Crystals: An International Journal of Science and Technology, May 1, 2007, pp. 633-639, vol. 34, No. 5, Taylor & Francis, Great Britain.

OTHER PUBLICATIONS

Aldred, M P, et al., "Organic Electroluminescence Using Polymer Networks From Smectic Liquid Crystals", Liquid Crystals, An International Journal of Science and Technology, Apr. 1, 2006, pp. 459-467, vol. 33, No. 4, Taylor & Francis, Great Britain.

* cited by examiner

*Primary Examiner* — Gregory Clark
(74) *Attorney, Agent, or Firm* — Nexsen Pruet, PLLC; E. Eric Mills

(57) ABSTRACT

The invention provides a photopolymerisable or photocrosslinkable reactive mesogen for forming a charge transporting or light emitting polymer network, the mesogen having an asymmetric structure (II): $B_1-S_1-A_1-M-(A-S-B)_n$ (II) wherein: A and $A_1$ are chromophores; S and $S_1$ are spacers; B and $B_1$ are endgroups which are susceptible to photopolymerisation or photocrosslinking; M is a non-chromophoric aliphatic, alicyclic or aromatic moiety; and n is an integer from 1 to 3; wherein, when the value of n is greater than 1, each of the groups A, S and B may be the same or different. Preferably, M is of the formula $Y-Z_m$, wherein Y is an aliphatic, alicyclic, aromatic or heterocyclic moiety, Z is an aliphatic linking group and m is an integer from 2 to 4, and wherein each of the Z groups may be the same or different. The invention also provides a material for forming a light emitting or charge transporting polymer network comprising the photopolymerisable or photocrosslinkable reactive mesogen, a charge transporting or light emitting polymer network which is obtained by polymerisation or crosslinking of the mesogen, a process for the preparation of the polymer via photopolymerisation or photocrosslinking of suitable end-groups of the mesogen, a device comprising a polymer layer formed from the charge transporting or light emitting polymer network, a process for applying a charge transporting or light emitting polymer network to a surface and a backlight or display comprising a charge transporting or light emitting polymernetwork.

19 Claims, 8 Drawing Sheets

POLYMER NETWORKS

FIELD OF THE INVENTION

The present invention relates to novel charge transporting and light emitting polymers and their precursors, and the use of the polymers in organic light emitting diodes. The invention also concerns methods for the preparation of these polymers.

BACKGROUND TO THE INVENTION

Various methods are available for the provision of flat panel displays. For example, liquid crystal displays (LCDs) and plasma systems are well known in the art. Such systems, however, typically require intense back lighting which presents a heavy drain on power. In addition, the low intrinsic brightness of LCDs is believed to be due to high losses of light caused by the absorbing polarizers and filters which can result in external transmission efficiencies of as low as 4%.

More recently, therefore, attention has focused on the use of organic light emitting diodes (OLEDs) for this purpose, such systems offering advantages over the earlier technologies in terms of high brightness, low voltage operation and low power consumption, much wider viewing angles, lower cost and improved response times. In addition, OLEDs can be produced in a light and very thin form on flexible substrates, such as plastics, via roll-to-roll processing.

There have been two main approaches to the production of OLEDs in the prior art. In the first approach, layers of small fluorescent or phosphorescent organometallic molecules and charge-transporting compounds in glassy state have been deposited on substrates by means of thermal vapour deposition in vacuum ovens, with patterning/pixilation being achieved by the use of masks or shadow masks. However, these systems had drawbacks in terms of non-scalability, so that only small displays could be produced. In addition, the requirement for the use of multiple chromophoric moieties within these systems resulted in problems with differential chromophore ageing, and the systems also suffered from fragile layers, high cost (associated with the use of batch vacuum deposition processes), and no capability for polarised emission.

Subsequently, attention focused on the use of polymer light-emitting diodes (PLEDs), comprising light-emitting and charge-transporting conjugated polymers in a glassy state which are solution deposited on a substrate by means of techniques such as inkjet printing or spin coating, or using doctor blade technology. Patterning/pixilation is effected by means of inkjet techniques with polyimide templates. Unfortunately, the use of inkjet deposition processes produces large round pixels, and the technique generally has limited multilayer capability, so that displays are often monochrome, there is no triplet emission, scalability problems arise, and polarised emission is complex and expensive.

Hence, in the light of the various disadvantages associated with these prior art systems, the present inventors investigated the use of liquid crystal organic light-emitting diode materials (LC-OLEDs) which comprised light-emitting and charge-transporting liquid crystals as polymer networks. These materials were deposited on substrates by means of solution processing using spin coating, inkjet printing, doctor blade techniques, and patterning/pixilation was achieved by means of photolithography using photo-masks.

These LC-OLED systems showed advantages over the prior art in terms of patternability, which could be achieved using standard LCD manufacturing processes and equipment, for example, by means of photolithography using UV illumination through shadow masks. The systems also had a multilayer capability, forming insoluble and intractable polymer networks, could be obtained using the above solution and low temperature processing methods of spin coating, ink-jet printing and doctor blade techniques, and were available at low cost. In addition, the systems are scalable to large-area displays, have a facility for polarised emission for LCD backlights and security applications (holography) and display high charge-carrier mobility values due to the presence of efficient charge transport layers.

Thus, in a series of patents including U.S. Pat. Nos. 6,867,243 B2, 7,166,239 B2, 7,199,167 B2 and 7,265,163 B2, the present inventors have disclosed a class of light emitting polymers which can be employed in displays which provide opportunities for systems having lower power consumption and/or higher brightness. The combination of these light emitting polymers with existing LCD technology has offered the possibility of achieving low-cost, bright, portable displays with the benefits of simple manufacturing and enhanced power efficiency.

The disclosed light emitting polymers are obtained by a polymerisation process which involves polymerisation of reactive mesogens, typically in liquid crystal form, via photopolymerisation of suitable end-groups of the mesogens. Thus, a process for the formation of a light emitting polymer is disclosed, the process comprising photopolymerisation of a reactive mesogen having the formula (I):

B-S-A-S-B  (I)

wherein:
A is a chromophore;
S is a spacer; and
B is an endgroup which is susceptible to photopolymerisation.

The photopolymerisation process may be schematically represented as set forth in FIG. 8, wherein C is a chromophore, PG is a polymerisable group, and S is an aliphatic spacer.

Thus, the present inventors have disclosed a series of materials having a linear structure wherein polymerisable end groups are separated by linear aliphatic spacers from the linear chromophoric core of the material and, whilst these materials offer acceptable performance in a number of applications, there is still a requirement for different and enhanced levels of performance in other applications. Thus, for example, it is frequently desirable that materials have improved hole transporting and hole collecting properties, and the ability to tailor materials accordingly would be highly desirable. Furthermore, low melting point materials which are liquid crystalline at or around room temperature could lead to significantly easier methods of manufacture. It is these requirements that are addressed by the present invention.

SUMMARY OF THE INVENTION

Thus, according to a first aspect of the present invention, there is provided a photopolymerisable or photocrosslinkable reactive mesogen for forming a charge transporting or light emitting polymer network, said mesogen having an asymmetric structure (II):

$B_1\text{-}S_1\text{-}A_1\text{-}M\text{-}(A\text{-}S\text{-}B)_n$  (II)

wherein:
   A and $A_1$ are chromophores;
   S and $S_1$ are spacers;
   B and $B_1$ are end groups which are susceptible to photopolymerisation or photocrosslinking;
   M is a non-chromophoric aliphatic, alicyclic or aromatic moiety; and
   n is an integer from 1 to 10;
wherein, when the value of n is greater than 1, each of the groups A, S and B may be the same or different.

Preferably, n has a value of from 2 to 6 and, more preferably, n is 2 or 3.

Preferably, M is of the formula $Y-Z_m$, wherein Y is an aliphatic, alicyclic or aromatic moiety, Z is an aliphatic linking group and m is an integer from 2 to 4, and wherein each of the Z groups may be the same or different.

According to a second aspect of the invention, there is provided a material for forming a charge transporting or light emitting polymer network, said material comprising at least one photopolymerisable or photocrosslinkable reactive mesogen, said at least one mesogen having the asymmetric structure (II):

$$B_1\text{-}S_1\text{-}A_1\text{-}M\text{-}(A\text{-}S\text{-}B)_n \qquad (II)$$

wherein A, $A_1$, S, $S_1$, B, $B_1$, M and n are as hereinbefore defined.

Optionally, said material according to the second aspect of the invention comprises at least one additional photopolymerisable or photocrosslinkable reactive mesogen which, in a preferred embodiment may have the formula (I):

$$B\text{-}S\text{-}A\text{-}S\text{-}B \qquad (I)$$

wherein:
   A is a chromophore;
   S is a spacer; and
   B is an endgroup which is susceptible to photopolymerisation or photocrosslinking.

According to a third aspect of the present invention, there is provided a charge transporting or light emitting polymer network which is obtained by polymerisation or crosslinking of a material according to the second aspect of the invention which comprises at least one photopolymerisable or photocrosslinkable reactive mesogen according to the first aspect of the invention. Typically, said mesogen comprises a charge-transporting or light emitting photopolymerisable or photocrosslinkable semiconductor.

In embodiments of the third aspect of the invention wherein said light emitting or charge transporting polymer network is obtained by polymerisation or crosslinking of a composition additionally comprising at least one additional photopolymerisable or photocrosslinkable reactive mesogen, said at least one additional photopolymerisable or photocrosslinkable mesogen preferably has the formula (I):

$$B\text{-}S\text{-}A\text{-}S\text{-}B \qquad (I)$$

wherein A, S and B are as hereinbefore defined.

According to a fourth aspect of the invention, there is provided a process for the preparation of a polymer network according to the third aspect of the invention from a material according to the second aspect of the invention, said process comprising the polymerisation or crosslinking of said material comprising at least one reactive mesogen via photopolymerisation or photocrosslinking of suitable end-groups of the at least one mesogen.

More particularly, there is provided a process for forming a charge transporting or light emitting polymer network comprising photopolymerisation or photocrosslinking of a composition comprising at least one reactive mesogen having the formula (II):

$$B_1\text{-}S_1\text{-}A_1\text{-}M\text{-}(A\text{-}S\text{-}B)_n \qquad (II)$$

wherein A, $A_1$, S, $S_1$, B, $B_1$, M and n are as hereinbefore defined, and wherein said process provides an asymmetric charge transporting or light emitting polymer network comprising arrangements of chromophores spaced by a crosslinked polymer backbone.

In a preferred embodiment of the fourth aspect of the invention said process for the preparation of a polymer according to the third aspect of the invention comprises the preparation of a polymer from at least one reactive mesogen according to the first aspect of the invention and at least one additional photopolymerisable or photocrosslinkable mesogen, said process comprising the polymerisation or crosslinking of said reactive mesogens via photopolymerisation or photocrosslinking of suitable end-groups of the mesogens. In a preferred embodiment, said at least one additional photopolymerisable or photocrosslinkable mesogen has the formula (I), as hereinbefore defined.

According to a fifth aspect of the present invention, there is provided a device comprising either a layer formed from at least one material according to the second aspect of the invention or a polymer layer formed from at least one polymer according to the third aspect of the invention. Typically, said device is obtained by a process according to the sixth aspect of the invention.

Thus, according to a sixth aspect of the present invention, there is provided a process for applying a charge transporting and/or light emitting polymer to a surface, said process comprising applying a material according to the second aspect of the invention to said surface and photopolymerising or photocrosslinking said material in situ to form at least one charge transporting or light emitting polymer network. Preferably, said material is applied to said surface, typically from solution, by means of a spin-coating technique. Preferably, said surface comprises a photoalignment layer.

According to a seventh aspect of the present invention, there is provided a backlight or display comprising at least one material according to the second aspect of the invention or at least one charge transporting or light emitting polymer network according to the third aspect of the invention.

BRIEF DESCRIPTION OF THE DRAWINGS

Embodiments of the invention are further described hereinafter with reference to the accompanying drawings, in which.

DETAILED DESCRIPTION OF THE INVENTION

Figure 1:
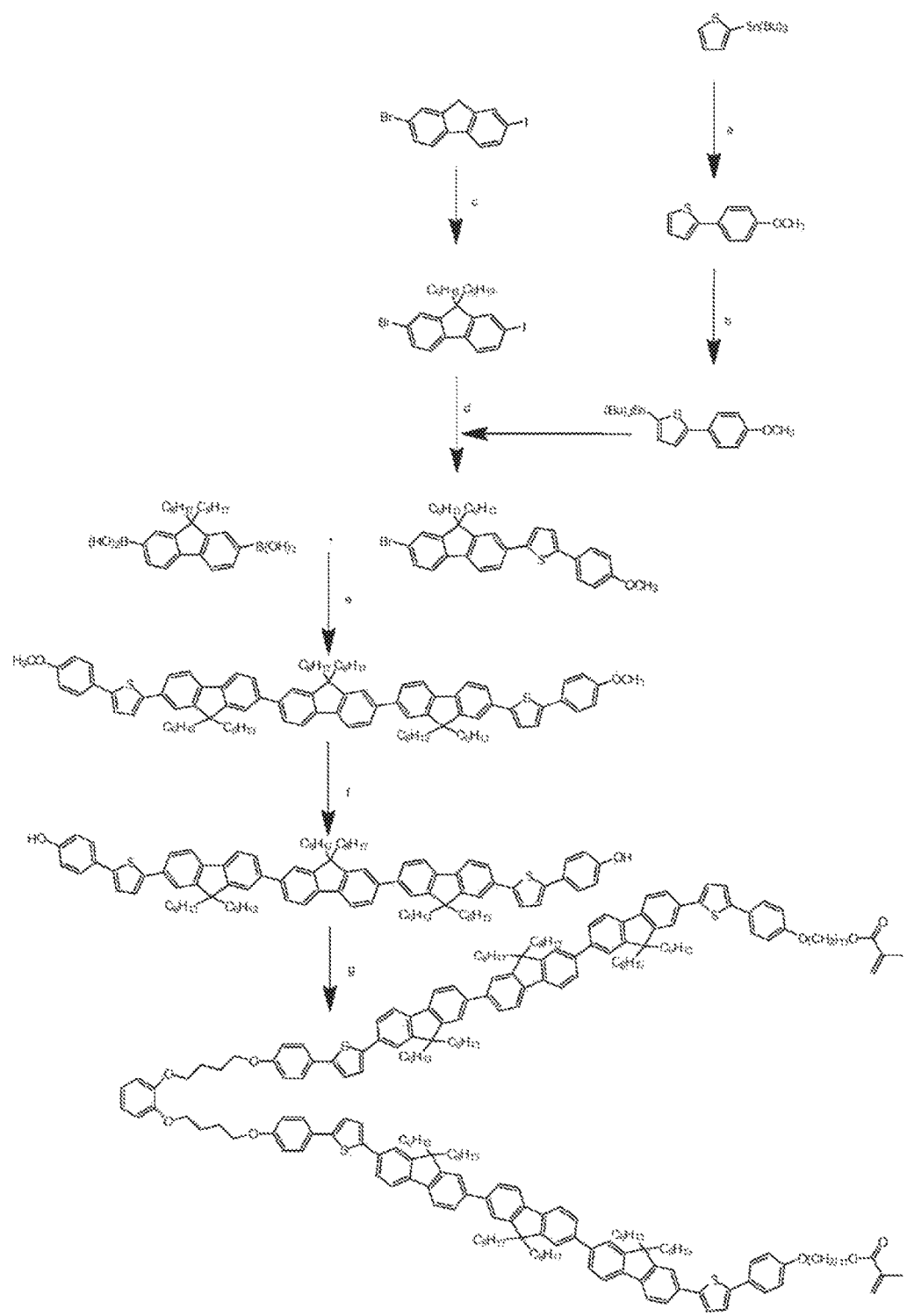
FIG. 1 is a reaction scheme illustrating the synthesis of a first asymmetric reactive mesogen.

The present inventors have provided photopolymerisable or photocrosslinkable reactive mesogens for use in the formation of charge transporting or light emitting polymer networks, said mesogens having an asymmetric structure (II):

$$B_1\text{-}S_1\text{-}A_1\text{-}M\text{-}(A\text{-}S\text{-}B)_n \quad (II)$$

wherein:
A and $A_1$ are chromophores;
S and $S_1$ are spacers;
B and $B_1$ are endgroups which are susceptible to photopolymerisation or photocrosslinking;
M is a non-chromophoric aliphatic, alicyclic or aromatic moiety; and
n is an integer from 1 to 3;
wherein, when the value of n is 2 or 3, each of the groups A, S and B may be the same or different.

Preferably, M is of the formula $Y\text{-}Z_m$, wherein Y is an aliphatic, alicyclic, aromatic or heterocyclic moiety, Z is an aliphatic linking group and m is an integer from 2 to 4, and wherein each of the Z groups may be the same or different.

Suitable chromophore groups (A) include fluorene, vinylenephenylene, anthracene, perylene and derivatives thereof. Useful chromophores are described, for example, in A. Kraft, A. C. Grimsdale and A. B. Holmes, *Angew. Chem. Int. Ed. Eng.* (1998), 37, 402.

Useful spacer groups (S) typically comprise organic chains, including, for example, flexible aliphatic, amine, ester or ether linkages. The chains may be saturated or unsaturated and may be linear or branched. Aliphatic spacers are preferred. The presence of spacer groups aids the solubility and lowers the melting point of the reactive mesogen monomer which enhances the coating properties thereof.

Favoured endgroups (B) are susceptible to photopolymerisation or photocrosslinking, typically by means of a radical process using UV radiation, generally unpolarized radiation.

The group M is a polyvalent linking group, preferably a di- tri- or tetravalent linking group. M is preferably of the formula $Y\text{-}Z_m$ wherein Y is a polyvalent core molecule, preferably a di- tri- or tetravalent core molecule, and each Z group is a linking group. The Z groups may be the same or different. Suitable core molecules Y comprise aromatic, heterocyclic or alicyclic ring systems and may, for example, be chosen from benzene, naphthalene or carbazole rings which comprise two, three or four linking groups Z. The linking groups Z typically comprise aliphatic linking groups such as those which are comprised in the spacer groups S.

The reactive mesogen monomer typically has a molecular weight of from 400 to 2,000. Lower molecular weight monomers are preferred because their viscosity is also lower, thereby leading to enhanced spin coating characteristics and shorter annealing times, which aid processing.

The charge transporting or light emitting polymer network according to the third aspect of the invention typically has a molecular weight of above 4,000, more particularly from 4,000 to 15,000. The charge transporting or light emitting polymer network generally comprises from 5 to 50, preferably from 10 to 30, monomeric units.

The polymer network may comprise a light emitting electroluminescent polymer, a hole transporting polymer, or an electron transporting polymer. This light emitting or charge transporting polymer may be used in a variety of devices including, but not limited to, electronic devices, light emitting devices, organic light emitting devices, lighting elements, organic field effect transistors, photovoltaics and lasers. In certain embodiments of the invention, the polymer network may be used as a host for phosphorescent emitters.

The process according to a fourth aspect of the invention, which provides for the preparation of a polymer according to the third aspect of the invention, comprises the polymerisation or crosslinking of a material comprising at least one reactive mesogen via photopolymerisation or photocrosslinking of suitable end-groups of the at least one mesogen.

A typical crosslinking or polymerisation process involves exposure of a reactive mesogen of general formula (II) to UV radiation to form either an excited state or an initial radical having at least one radicalised endgroup B. or $B_1$. which is capable of reacting with another B or $B_1$ endgroup.

Preferably, the endgroup B or $B_1$ is selected to be susceptible to photopolymerisation or photocrosslinking and the polymer is formed by photopolymerisation or photocrosslinking. The photopolymerisation or photocrosslinking may be performed substantially free, or preferably completely free, of photoinitiator. In preferred embodiments of the invention, the process results in crosslinking, e.g. to form a polymer network, preferably an insoluble, crosslinked network.

Suitable photopolymerisable endgroups include acrylates, methacrylates and non-conjugated 1,4, 1,5 and 1,6 dienes. Suitable photocrosslinkable endgroups include coumarins and cinnamates, including derivatives of 6- or 7-hydroxy-coumarins, as described by M O'Neill and S M Kelly, *J. Phys. D. Appl. Phys.* (2000), 33, R67.

In those embodiments wherein the endgroups are dienes, the reaction typically involves cyclopolymerisation by means of a sequential intramolecular and intermolecular propagation, wherein a ring structure is formed first by reaction of the free radical with the second double bond of the diene group. A double ring is then obtained by the cyclopolymerisation, thereby providing a particularly rigid backbone. The reaction is, in general, sterically controlled. In preferred aspects of the invention, the polymerisation process results in crosslinking to form a polymer network, typically an insoluble, cross-linked network.

In certain aspects of the invention, the photopolymerisation or photocrosslinking process may be conducted at room temperature, thereby minimising any possible thermal degradation of the reaction mesogen or polymer entities. Photopolymerisation is preferable to thermal polymerisation because it allows subsequent sub-pixellation of the formed polymer by lithographic means.

Further steps may be conducted subsequent to the polymerisation process, for example the polymer may be doped with e.g. photoactive dyes.

Preferably, the light emitting polymer network is a liquid crystal which can be aligned to emit polarised light. A suitable class of polymers may be based on a central fluorene ring structure.

The process according to the sixth aspect of the invention for applying a light emitting polymer to a surface comprises applying a material according to the second aspect of the invention to said surface and photopolymerising or photocrosslinking said material in situ to form a light emitting polymer. Preferably, said material is applied to said surface by means of a spin-coating technique.

In preferred embodiments of the invention, said surface comprises a photoalignment layer. The photoalignment layer typically comprises a chromophore attached to a sidechain polymer backbone by a flexible spacer entity. Suitable chromophores include cinnamates or coumarins, including derivatives of 6 or 7-hydroxycoumarins. Suitable flexible spacers comprise unsaturated organic chains, including, for example, aliphatic, amine or ether linkages.

Exemplary photoalignment layers comprise, for example, 7-hydroxycoumarin compounds. Other suitable materials for use in photoalignment layers are described in M. O'Neill and S. M. Kelly, *J. Phys. D. Appl. Phys.* (2000), 33, R67.

In certain aspects of the invention, the photoalignment layer is photocurable. This allows for flexibility in the angle in the azimuthal plane at which the light emitting polymer (e.g. as a liquid crystal) is alignable and, thus, flexibility in its polarisation characteristics. The photalignment layer may also be doped with a hole transport compound, i.e. a compound which enables transport of holes within the photoalignment layer, such as a triarylamine. Examples of suitable triarylamines include those described in C. H. Chen, J. Shi, C. W. Tang, *Macromol Symp.* (1997) 125, 1. An exemplary hole transport compound is 4,4',4"-tris[N-(1-napthyl)-N-phenylamino]triphenylamine.

Optionally, the hole transport compound has a tetrahedral (pyramidal) shape which acts so as to controllably disrupt the alignment characteristics of the layer. In one embodiment, the photoalignment layer includes a copolymer incorporating both linear rod-like hole-transporting and photoactive side chains.

The charge transporting or light emitting polymer network is aligned on the photoalignment layer. Suitably, the photoaligned polymer comprises uniaxially aligned chromophores. Typically polarization ratios of 30 to 40 are required, but with the use of a clean up polarizer ratios of 10 or more can be adequate for display uses.

The charge transporting or light emitting polymer network may be aligned by a range of methods including mechanical stretching, rubbing, and Langmuir-Blodgett deposition. Mechanical alignment methods can however lead to structural degradation. The use of rubbed polyimide is a suitable method for aligning the light emitting polymer, especially in the liquid crystal state. However, standard polyimide alignment layers are insulators, giving rise to low charge injection for OLEDs.

The susceptibility to damage of the alignment layer during the alignment process can be reduced by the use of a non-contact photoalignment method. In such methods, illumination with polarized light introduces a surface anisotropy to the alignment layer and hence a preferred in-plane orientation to the overlying light emitting polymer (e.g. in liquid crystal form). M. O'Neill, S. M. Kelly, *J. Appl. Phys. D* (2000) 33, R67, provides a review of photalignment materials and methods.

In preferred embodiments of the invention, the aligned charge transporting or light emitting polymer network is in the form of an insoluble nematic polymer network. Cross-linking has been found to improve the photoluminescence properties.

The device according to the fifth aspect of the invention may optionally comprise additional layers such as carrier transport layers. The presence of an electron-transporting polymer layer, for example comprising an oxadiazole ring-containing compound, has been found to increase electroluminescence.

Subsequent pixelation of the light emitter may be achieved by selective photopatterning to produce red, green and blue pixels as desired. The pixels are typically rectangular in shape. The pixels typically have a size of from 1 to 50 µm. For microdisplays the pixel size is likely to be from 1 to 50 µm, preferably from 5 to 15 µm, more preferably from 8 to 10 µm. For other displays, larger pixel sizes, e.g. 300 µm, are more suitable.

In one preferred aspect, the pixels are arranged for polarized emission. Suitably, the pixels are of the same colour but have their polarization direction in different orientations. To the naked eye this would appear as one colour but, when viewed through a polarizer, some pixels would be bright and others less bright, thereby giving an impression of 3D viewing when viewed with glasses having a different polarization for each eye.

The layers may also be doped with photoactive dyes which may comprise dichroic or pleochroic dyes, or phosphorescent emitters. Examples include anthraquinone dyes, tetralines or rare earth emitters, such as organometallic chromophores incorporating indium and europium, including those described in S. M. Kelly, *Flat Panel Displays: Advanced Organic Materials*, RSC Materials Monograph, Ed. J. A. Connor, (2000). Different dopant types can be used to obtain different pixel colours.

Pixel colour can also be influenced by the choice of chromophore, with different chromophores having more suitability as red, green or blue pixels, for example using suitably modified anthraquinone dyes.

Multicolour emitters are also envisaged within the scope of the present invention, said emitters comprising arrangements or sequences of different pixel colours. Thus, for example, a suitable multicolour emitter comprises stripes of red, green and blue pixels having the same polarization state. This may be used as a sequential colour backlight for a display which allows the sequential flashing of red, green and blue lights. Such backlights can be used in transmissive and reflective FLC displays where the FLC acts as a shutter for the flashing coloured lights.

A further suitable multicolour emitter comprises a full colour pixelated display in which the component pixels thereof have the same or different alignment. Suitable multicolour emitters may be formed by a sequential coat, selective cure, wash off process in which a first colour emitter is applied to the aligned layer by a suitable coating process (e.g. spin coating). The coated first colour emitter is then selectively cured only where pixels of that colour are required. The residue (of uncured first colour emitter) is then washed off. A second colour emitter is subsequently applied to the aligned layer, cured only where pixels of that colour are required, and the residue is washed off. If desired, a third colour may be applied by repeating the process for the third colour. This process may be used to form a pixelated display such as for use in a colour emissive display, and is simpler than traditional printing (e.g. ink jet) methods of forming such displays.

The invention also envisages a backlight for a display comprising a power input and a charge transporting or light emitting polymer network. The backlight may be arranged for use with a liquid crystal display. Optionally, the backlight may be monochrome or multicolour. The invention also provides a display comprising a screen and a charge transporting or light emitting polymer network or backlight as hereinbefore described. The screen may have any suitable shape or configuration, including flat or curved, and may comprise any suitable material, such as glass or a plastic polymer. The charge transporting and light emitting polymer networks of the present invention have been found to be particularly suitable for use with screens comprising plastic polymers such as polyethylene or polyethylene terephthalate (PET).

The display is suitable for use in consumer electronic goods such as mobile telephones, hand-held computers, watches and clocks and games machines. There is also envisaged a security viewer, e.g. in kit form, which comprises a charge transporting or light emitting polymer network according to the invention wherein the pixels are arranged for polarized emission, and view glasses having a different polarization for each eye.

The method according to the sixth aspect of the invention also envisages a method of forming a light emitter for a display which comprises forming a photoalignment layer and aligning a light emitting polymer on said photoalignment layer. Alternatively, there is provided a method of forming a light emitter for a display comprising forming a photoalignment layer, aligning a reactive mesogen on said photoalignment layer, and forming a charge transporting or light emitting polymer network by photopolymerisation or photocrosslinking of said reactive mesogen.

The invention also provides a method of forming a multicolour emitter comprising applying a first colour light emitting polymer to the photoalignment layer, selectively curing said first colour light emitter only where that colour is required, washing off any residue of uncured first colour emitter, and repeating the process for a second and any subsequent light colour emitters.

The asymmetric structures disclosed herein offer distinct advantages over the prior art symmetric derivatives of formula (I). The different chromophoric (A) groups can each emit different colours, allowing for white light with blue, green and red peaks to be obtained for backlight applications. Such an approach avoids the kind of problems which limit the performance of white-emitting blends, such as bias-dependent EL spectra and intrinsic phase separation during long-term device operation. Alternatively the different (A) groups may have hole-transporting, electron-transporting and emission properties in order to balance charge transport in the EL device. Furthermore, the bulky central (M) groups inhibit aggregation and so avoid the quenching of luminescence and, additionally, the melting points of the new asymmetric compounds will be lower, and the solubility in organic solvents will be higher, than for the corresponding linear compounds of formula (I).

Referring now to the accompanying Figures, there are illustrated reaction schemes for the synthesis of seven different asymmetric reactive mesogens according to the invention. Thus, in FIG. 1 there is shown the synthesis of an asymmetric reactive mesogen prepared by reacting 2-bromo-7-iodo-9,9-dihexylfluorene with tributyl-[5-(4-methoxyphenyl)thiophen-2-yl]stannane to give 2-(7-bromo-9,9-dihexylfluoren-2-yl)-5-(4-methoxyphenyl)thiophene which is subsequently condensed with 9,9-dioctylfluorene-2,7-diyl diboronic acid. The resulting 2,7-bis{7-[5-(4-(methoxy)phenyl]thiophen-2-yl}-9,9-dihexylfluoren-2-yl)-9,9-dioctylfluorene is converted to 2,7-bis{7-[5-(4-(hydroxy)phenyl]thiophen-2-yl}-9,9-dihexylfluoren-2-yl)-9,9-dioctylfluorene which is then condensed with (i) 11-bromoundecyl methacrylate and (ii) 1,2-bis(4-bromobutoxy)benzene to provide the asymmetric reactive mesogen.

Figure 2:
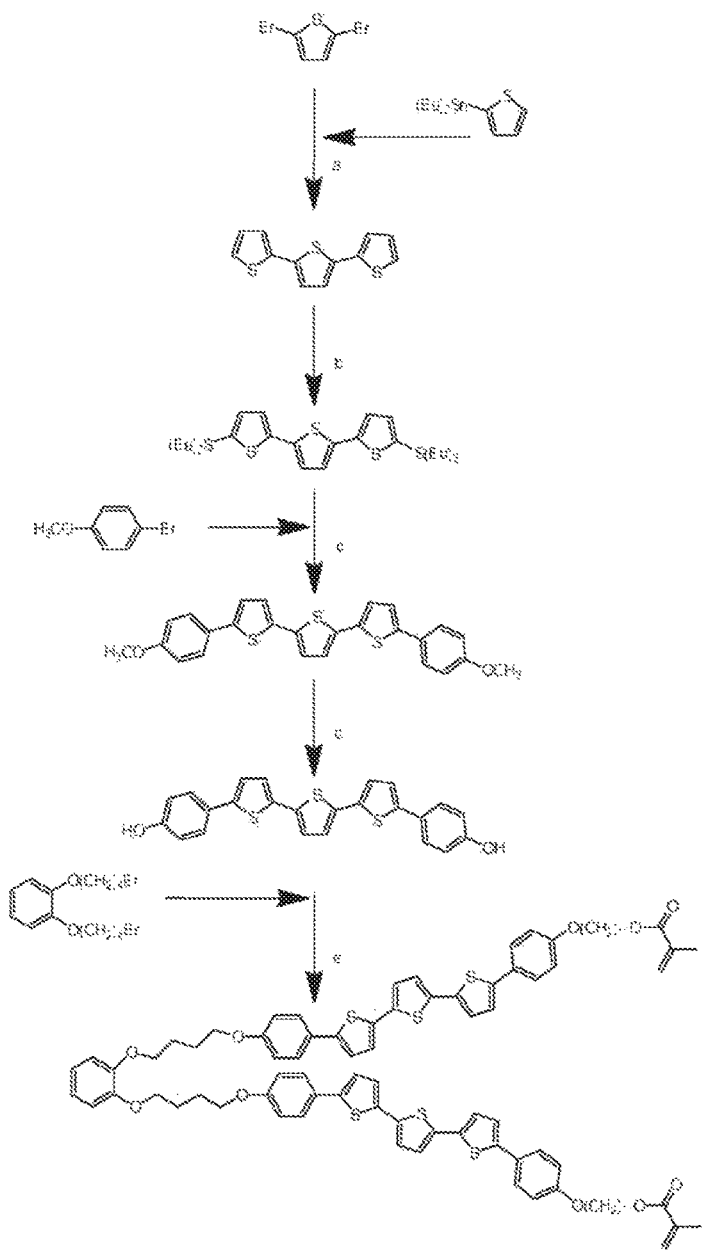
FIG. 2 is a reaction scheme illustrating the synthesis of a second asymmetric reactive mesogen.
Figure 3:
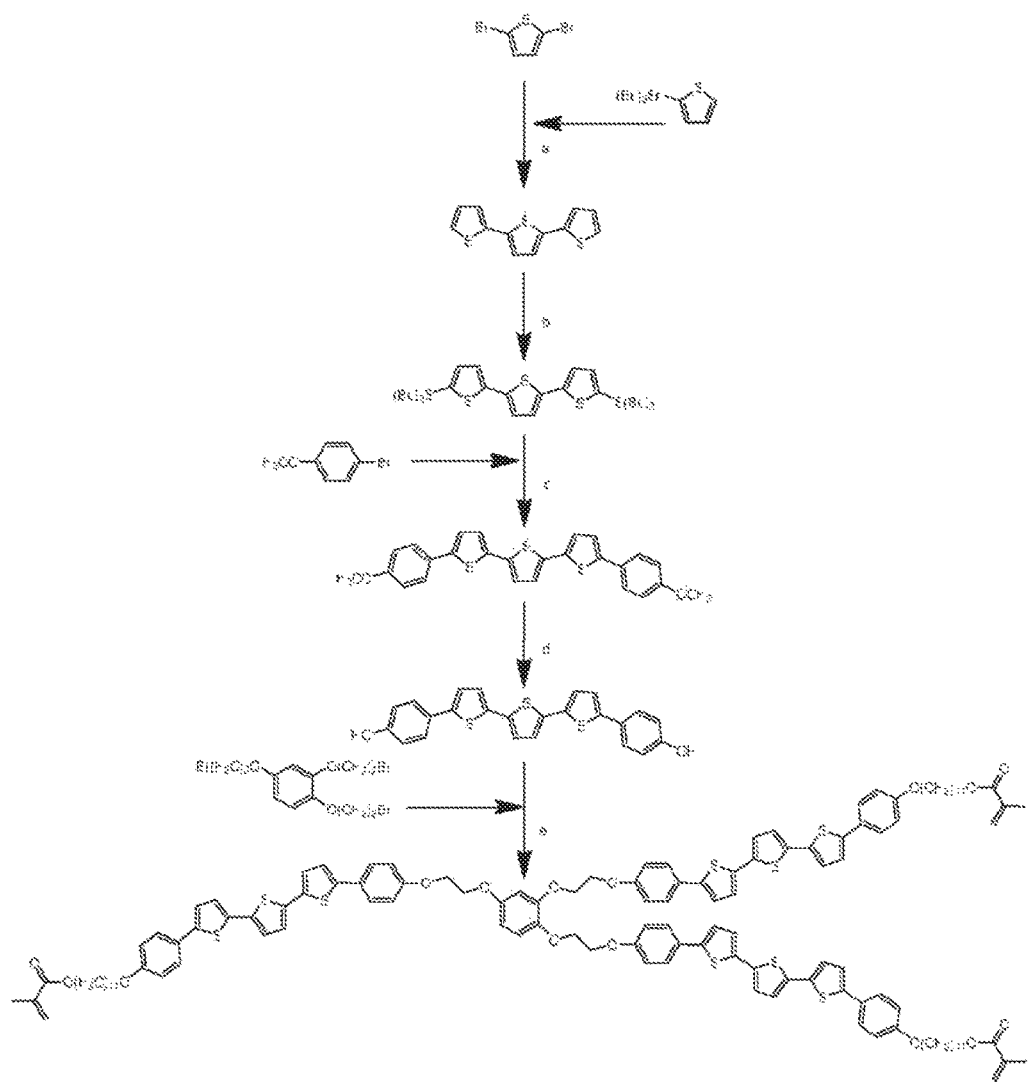
FIG. 3 is a reaction scheme illustrating the synthesis of a third asymmetric reactive mesogen.

Turning now to FIG. 2, a further asymmetric reactive mesogen is prepared from the condensation of 2,5-bis-[2(4-hydroxyphenyl)thiophen-5-yl]thiophene with (i) 11-bromoundecyl methacrylate and (ii) 1,2-bis(4-bromobutoxy)benzene, whilst FIG. 3 shows a still further asymmetric reactive mesogen obtained from the condensation of 2,5-bis-[2(4-hydroxyphenyl)thiophen-5-yl]thiophene with (i) 11-bromoundecyl methacrylate and (ii) 1,2,3-tris(4-bromobutoxy)benzene.

Figure 4:
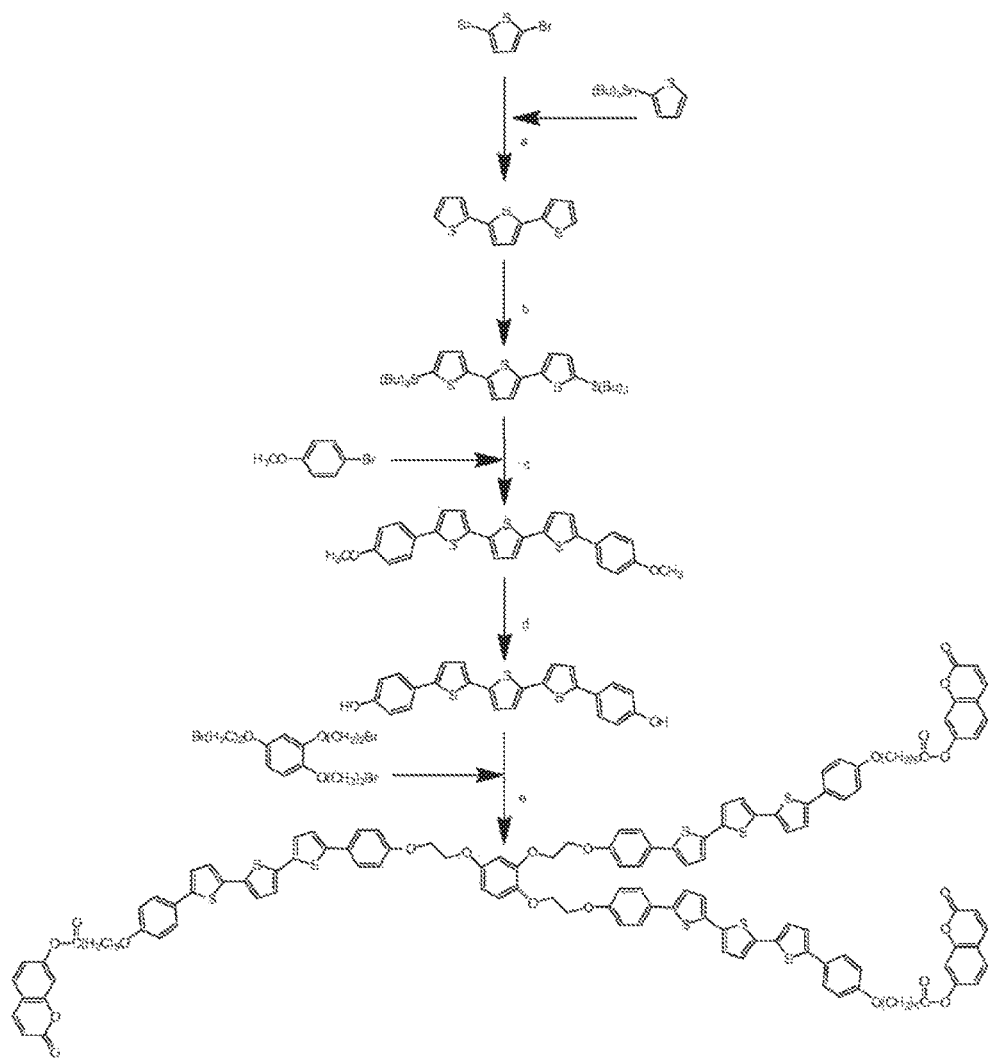
FIG. 4 is a reaction scheme illustrating the synthesis of a fourth asymmetric reactive mesogen.
Figure 5:
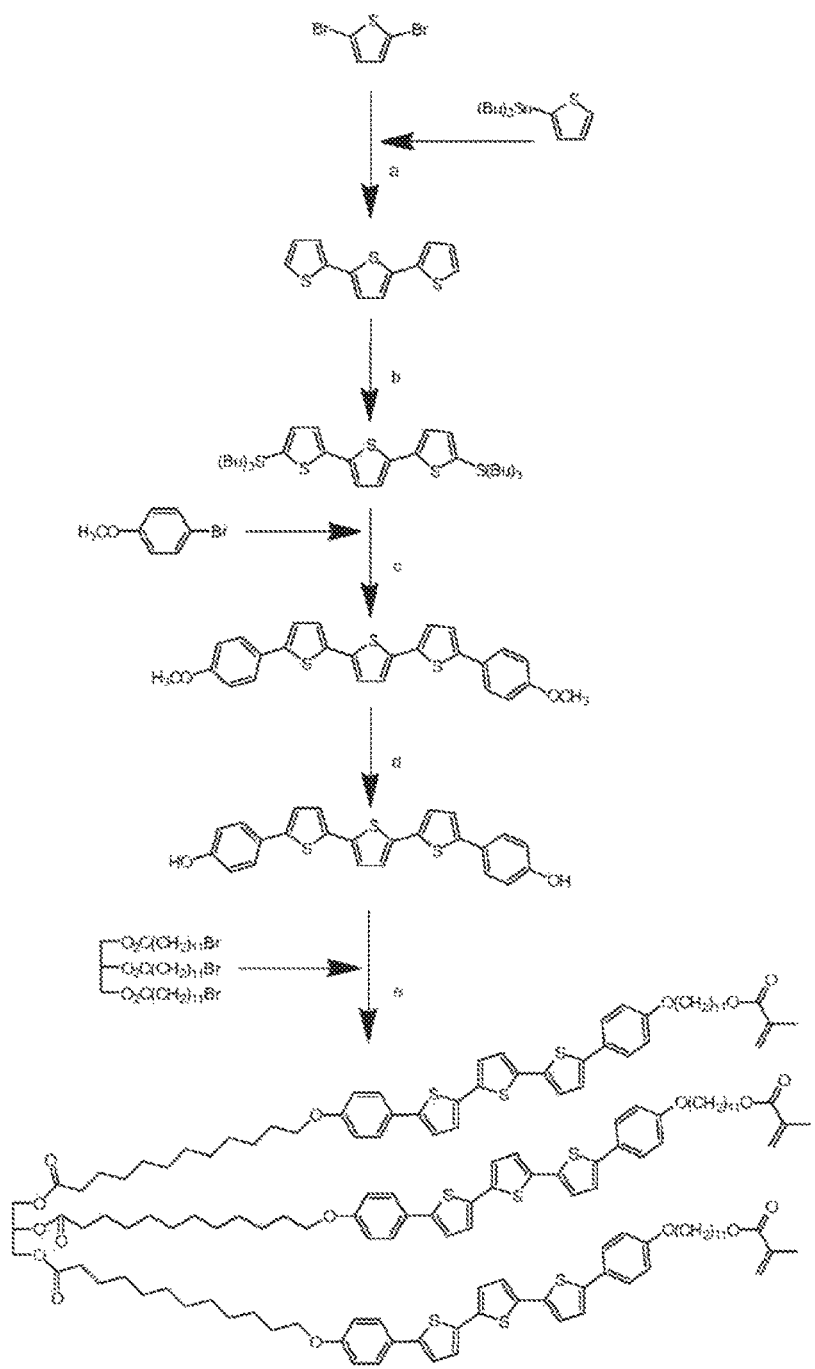
FIG. 5 is a reaction scheme illustrating the synthesis of a fifth asymmetric reactive mesogen.

In FIG. 4, there is illustrated the preparation of a yet further asymmetric reactive mesogen from the condensation of 2,5-bis-[2(4-hydroxyphenyl)thiophen-5-yl]thiophene with (i) (7-coumarinyl)-1-bromohexanoate and (ii) 1,2,3-tris(4-bromobutoxy)benzene and FIG. 5 depicts the formation of a further asymmetric reactive mesogen from the condensation of 2,5-bis-[2(4-hydroxyphenyl)thiophen-5-yl]thiophene with (i) 11-bromoundecyl methacrylate and (ii) glyceryl tri-(12-bromododecanoate).

Figure 6:
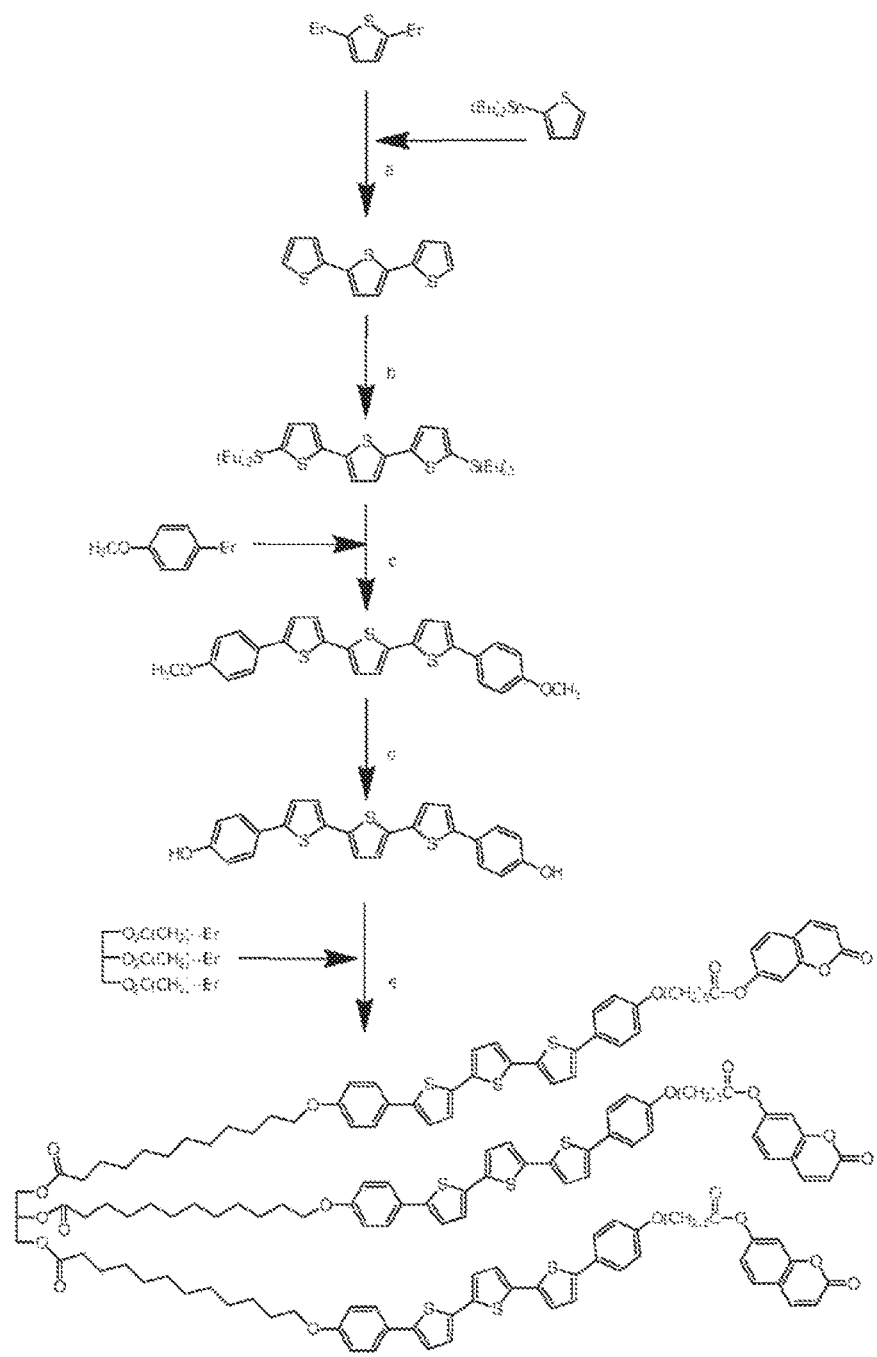
FIG. 6 is a reaction scheme illustrating the synthesis of a sixth asymmetric reactive mesogen.
Figure 7:
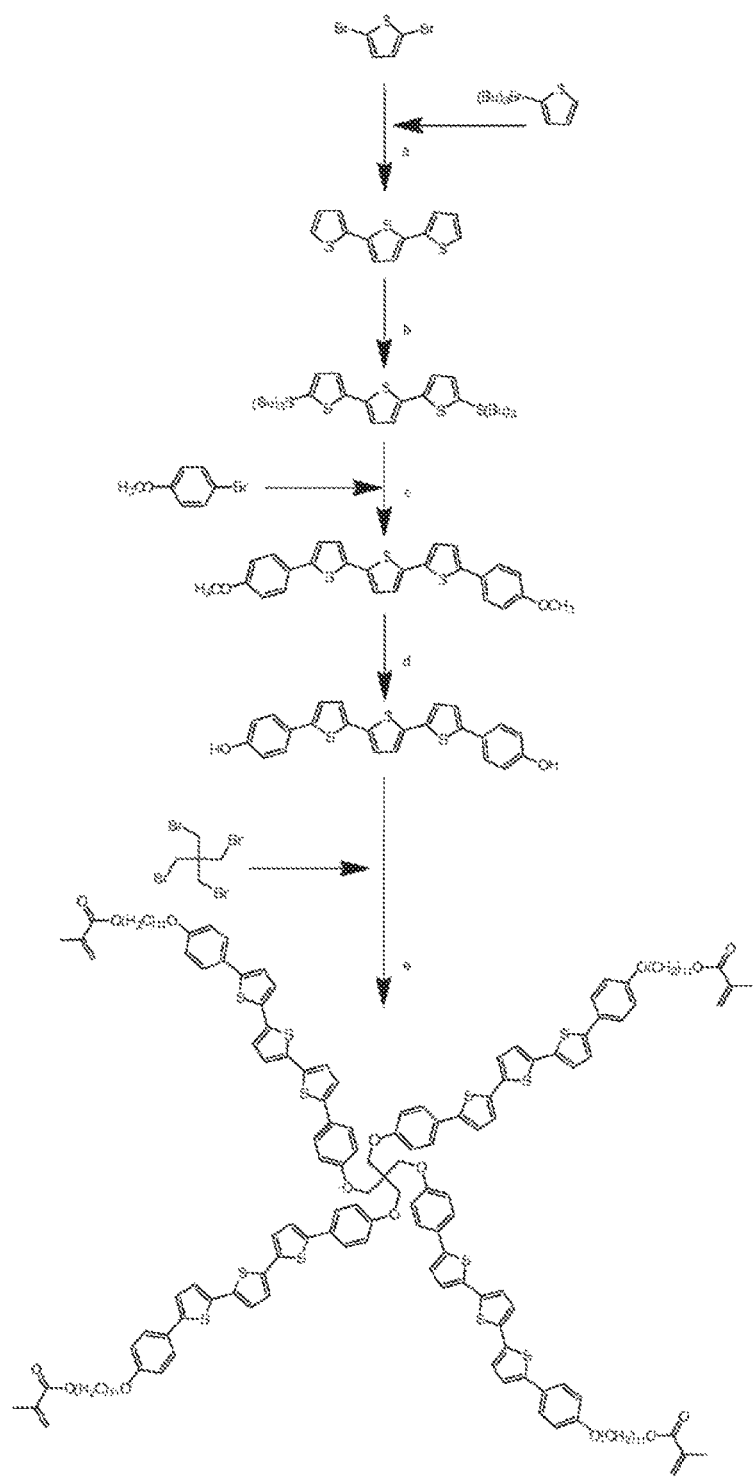
FIG. 7 is a reaction scheme illustrating the synthesis of a seventh asymmetric reactive mesogen.
Figure 8:
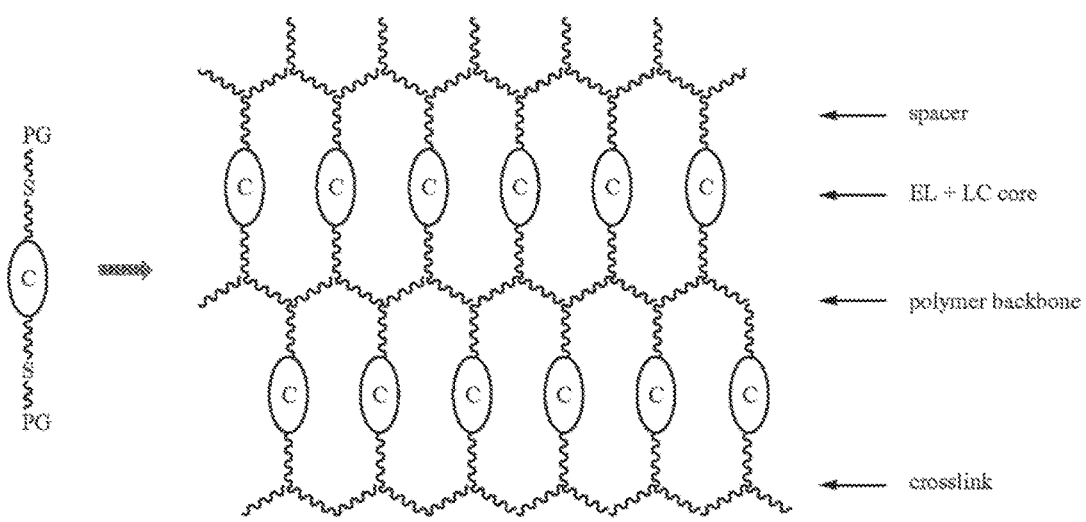
FIG. 8 is schematic representation of the photopolymerisation process.

Finally, FIG. 6 shows the preparation of a still further asymmetric reactive mesogen from the condensation of 2,5-bis-[2(4-hydroxyphenyl)thiophen-5-yl]thiophene with (i) (7-coumarinyl)-1-bromohexanoate and (ii) glyceryl tri-(12-bromododecanoate) whilst FIG. 7 illustrates the formation of a still further asymmetric reactive mesogen from the condensation of 2,5-bis-[2(4-hydroxyphenyl)thiophen-5-yl]thiophene with (i) 11-bromoundecyl methacrylate and (ii) 1,2,3,4-tetrabromoneopentane.

Specific embodiments of the invention will now be illustrated, without in any way limiting the scope of the invention, by the following example, which illustrates the preparation of the asymmetric reactive mesogen depicted in FIG. 1.

EXAMPLE

Synthesis of an Asymmetric Reactive Mesogen According to the Invention

1. Synthesis of 2-Bromo-7-iodo-9,9-dihexylfluorene

Powdered potassium hydroxide (6.43 g, 0.1146 mol) was added in small portions to a solution of 2-bromo-7-iodofluorene (10.00 g, 0.0270 mol), 1-bromohexane (9.79 g, 0.0593 mol), potassium iodide (0.45 g, 0.0027 mol) and dimethyl sulfoxide (200 cm$^3$) at room temperature. The deep purple mixture was stirred for three hours then poured into water (200 cm$^3$) and the crude product extracted into hexane (4×50 cm$^3$). The combined organic extracts were washed with brine (200 cm$^3$), dried (MgSO$_4$), filtered and concentrated under reduced pressure. Purification was carried out via column chromatography [silica gel, hexane] and recrystallisation from ethanol to yield 11.33 g (78%) of white crystalline needles.

2. Synthesis of 2-(4-Methoxyphenyl)thiophene

A mixture of thiophene-2-boronic acid (15.00 g, 0.1172 mol), 4-bromoanisole (17.54 g, 0.0938 mol), sodium phosphate dodecahydrate (44.56 g, 0.1172 mol), palladium on carbon (2.50 g, 0.0023 mol) and propan-2-ol/water (375 cm$^3$, 50/50, v/v) was heated at 80° C. overnight. The cooled reaction mixture was diluted with water (200 cm$^3$) and DCM (200 cm$^3$) then filtered through a celite pad. The organic layer of the filtrate was separated and washed with brine (200 cm$^3$), dried (MgSO$_4$), filtered and concentrated under reduced pressure. The crude product was purified via recrystallisation from ethanol to yield 14.26 g (80%) of a white crystalline solid.

3. Synthesis of Tributyl-[5-(4-methoxyphenyl)thiophen-2-yl]stannane

A solution of n-butyllithium (29.52 cm$^3$, 2.5 M, 0.0738 mol) was added dropwise to a cooled solution (−78° C.)

solution of 2-(4-methoxyphenyl)thiophene (11.70 g, 0.0615 mol) in tetrahydrofuran (150 cm$^3$). The mixture was stirred for 1 hour, maintaining the temperature at −78° C., followed by the dropwise addition of tributyl tin chloride (21.02 g, 0.0646 mol). The mixture was allowed to warm to room temperature and stirred overnight. The crude product was extracted into diethyl ether (2×200 cm$^3$), washed with water (200 cm$^3$), dried (MgSO$_4$), filtered and concentrated under reduced pressure. No further purification was carried out.

4. Synthesis of 2-(7-Bromo-9,9-dihexylfluoren-2-yl)-5-(4-methoxyphenyl)thiophene Tetrakis(triphenylphosphine)palladium(0) (9.27 g, 1.51×10$^{-4}$ mol) was added to a degassed solution of 2-bromo-7-iodo-9,9-dihexylfluorene (10.00 g, 0.0185 mol), tributyl-[5-(4-methoxyphenyl)thiophen-2-yl]stannane (13.33 g, 0.0278 mol) and dimethylformamide (100 cm$^3$). The mixture was stirred at 90° C. for sixteen hours, allowed to cool, poured into aqueous potassium fluoride (20%, 150 cm$^3$) and the crude product extracted into diethyl ether (4×100 cm$^3$). The combined organic extracts were washed with brine (2×100 cm$^3$), dried (MgSO$_4$), filtered and concentrated reduced pressure. Purification was carried out via column chromatography [silica gel, hexane:dichloromethane, 3:2] and recrystallisation from ethanol/dichloromethane, to yield 6.79 g (61%) an off white crystalline solid.

5. Synthesis of 2,7-bis{7-[5-(4-(Methoxy)phenyl]thiophen-2-yl}-9,9-dihexylfluoren-2-yl)-9,9-diocylfluorene Tetrakis(triphenylphosphine)palladium(0) (0.15 g, 1.30×10$^{-4}$ mol) was added to a degassed solution of 9,9-dioctyl-fluorene-2,7-diyl diboronic acid (1.25 g, 0.0026 mol), 2-(7-bromo-9,9-dihexylfluoren-2-yl)-5-(4-methoxyphenyl)thiophene (3.93 g, 0.0065 mol), potassium carbonate (1.08 g, 0.0078 mol) and 1,4-dioxane/water (15 cm$^3$, 2/1, v/v). The mixture was heated under reflux overnight. The reaction mixture was allowed to cool to room temperature and the crude product extracted into diethyl ether (3×100 cm$^3$). The combined extracts were washed with brine (100 cm$^3$), dried (MgSO$_4$), filtered and concentrated under reduced pressure. Purification was carried out by dissolving the crude product in the minimum amount of dichloromethane the precipitating into methanol followed by recrystallisation from ethanol/dichloromethane to yield 2.49 g (67%) of yellow crystalline solid.

6. Synthesis of 2,7-bis{7-[5-(4-(Hydroxy)phenyl]thiophen-2-yl}-9,9-dihexylfluoren-2-yl)-9,9-diocylfluorene Boron tribromide (4.91 cm$^3$, 1.0 M, 0.0042 mol) was added dropwise to a cooled (0° C.) solution of 2,7-bis{7-[5-(4-(methoxy)phenyl]thiophen-2-yl}-9,9-dihexylfluoren-2-yl)-9,9-diocylfluorene (1.50 g, 0.0010 mol) in dichloromethane (10.50 cm$^3$). The solution was stirred for two hours at room temperature then water (30 cm$^3$) added rapidly in one portion. The mixture was stirred for one hour then the product extracted into dichloromethane (4×100 cm$^3$). The combined organic extracts were washed with brine (100 cm$^3$), dried (MgSO$_4$), filtered and concentrated under reduced pressure. The crude product was purified via column chromatography [silica gel, 2:1, ethyl acetate:hexane] to yield 1.14 g (81%) of a yellow crystalline solid.

7. Synthesis of Asymmetric Reactive Mesogen

A mixture of 2,7-bis{7-[5-(4-(hydroxy)phenyl]thiophen-2-yl}-9,9-dihexylfluoren-2-yl)-9,9-diocylfluorene (0.25 g, 1.78×10$^{-4}$ mol), potassium carbonate (0.06 g, 4.45×10$^{-4}$ mol) and dimethylformamide (2 cm$^3$) was heated at 80° C. for two hours. 11-Bromoundecyl methacrylate (0.06 g, 1.96×10$^{-4}$ mol) was added in one portion and the reaction mixture stirred overnight. 1,2-bis(4-Bromobutoxy)benzene (0.03 g, 8.90 10$^{-5}$ mol) was added to the reaction mixture and stirred for a further twenty-four hours at 80° C. The cooled reaction mixture was poured into water (50 cm$^3$) and the crude product extracted into dichloromethane (4×50 cm$^3$). The combined organic extracts were washed with brine (100 cm$^3$), dried (MgSO$_4$), filtered and concentrated under reduced pressure. Purification was carried out via column chromatography [silica gel, dichloromethane:hexane, 1:1] to yield 0.31 g (50%) of a yellow crystalline solid.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A charge transporting or light emitting polymer network which is obtained by polymerisation or crosslinking of a material for forming a light emitting or charge transporting polymer network, said material comprising a photopolymerisable or photocrosslinkable reactive mesogen for forming a charge transporting or light emitting polymer network, said mesogen having the structure (II):

$$B_1\text{-}S_1\text{-}A_1\text{-}M\text{-}(A\text{-}S\text{-}B)_n \qquad (II)$$

wherein:
A and A$_1$ are chromophores and wherein the chromophores A and A$_1$ each comprise a fluorene group;
S and S$_1$ are spacers;

B and $B_1$ are endgroups which are susceptible to photopolymerisation or photocrosslinking;

M is a non-chromophoric aliphatic, alicyclic or aromatic moiety; and n is an integer from 1 to 10;

wherein, when the value of n is greater than 1, each of the groups A, S and B may be the same or different, and wherein n optionally has a value of from 2 to 6; and wherein said material optionally comprises at least one additional photopolymerisable or photocrosslinkable reactive mesogen, wherein said at least one additional photopolymerisable or photocrosslinkable reactive mesogen optionally has the formula (I):

$$B\text{-}S\text{-}A\text{-}S\text{-}B \qquad (I)$$

wherein:

A is a chromophore;

S is a spacer; and

B is an endgroup which is susceptible to photopolymerisation or photocrosslinking; and wherein said polymer network has a molecular weight of above 4,000, optionally in the range from 4,000 to 15,000 and optionally comprises from 5 to 50 monomeric units, and wherein said polymer network optionally comprises a light emitting electroluminescent polymer, a hole transporting polymer or an electron transporting polymer.

2. A process for the preparation of the polymer network of claim 1, said process comprising the polymerisation or crosslinking of said material comprising at least one reactive mesogen via photopolymerisation or photocrosslinking of suitable end-groups of the at least one mesogen, wherein said charge transporting or light emitting polymer network is optionally obtained by photopolymerisation or photocrosslinking of a composition comprising a reactive mesogen having the formula (II):

$$B_1\text{-}S_1\text{-}A_1\text{-}M\text{-}(A\text{-}S\text{-}B)_n \qquad (II)$$

wherein A, $A_1$, S, $S_1$, B, $B_1$, M and n are as hereinbefore defined, and wherein said process provides light emitting polymer comprising arrangements of chromophores spaced by a crosslinked polymer backbone.

3. A process as claimed in claim 2 wherein said process comprises the preparation of a polymer from the at least one reactive mesogen of claim 1 and at least one additional photopolymerisable or photocrosslinkable mesogen, said process comprising the polymerisation or crosslinking of said reactive mesogens via photopolymerisation or photocrosslinking of suitable end-groups of the mesogens.

4. A process as claimed in claim 2 wherein said photopolymerisation or photocrosslinking is performed substantially free, optionally completely free, of photoinitiator, wherein said process is optionally conducted at room temperature, and wherein said process optionally additionally comprises doping with photoactive dyes.

5. A process for applying a charge transporting or light emitting polymer network to a surface, said process comprising applying a material as claimed in claim 1 to said surface and photopolymerising or photocrosslinking said material in situ to form a charge transporting or light emitting polymer network, wherein said material is optionally applied to said surface by means of a spin-coating technique, wherein said material is optionally spin-coated from solution, and wherein said surface optionally comprises a photoalignment layer.

6. A process as claimed in claim 5 wherein said photoalignment layer comprises a chromophore attached to a sidechain polymer backbone by a flexible spacer entity, wherein said chromophore is optionally selected from cinnamates or coumarins and wherein said flexible spacer is optionally selected from aliphatic, amine or ether linkages.

7. A process as claimed in claim 6 wherein the charge transporting or light emitting polymer network is aligned on the photoalignment layer and is in the form of an insoluble nematic polymer network.

8. A process as claimed in claim 6 which additionally comprises doping with photoactive dyes.

9. A device comprising a polymer layer formed from at least one polymer of claim 1.

10. A device as claimed in claim 9 which is obtained by the process of claim 7.

11. A device as claimed in claim 9 which comprises at least one carrier transport layer.

12. A device as claimed in claim 9 which comprises a multicolour emitter, or which is selected from electronic devices, light emitting devices, organic light emitting devices, lighting elements, organic field effect transistors, photovoltaics and lasers or wherein said polymer network is optionally used as a host for phosphorescent emitters.

13. A backlight or display comprising a charge transporting or light emitting polymer network as claimed in claim 1.

14. A mobile telephone, hand-held computer, watch, clock, games machine or security viewer comprising a display as claimed in claim 13.

15. A polymer network which is obtained by polymerisation or crosslinking of a material, said material comprising a photopolymerisable or photocrosslinkable reactive mesogen for forming a charge transporting or light emitting polymer network, said mesogen having the structure (II):

$$B_1\text{-}S_1\text{-}A_1\text{-}M\text{-}(A\text{-}S\text{-}B)_n \qquad (II)$$

wherein

A and $A_1$ are chromophores;

S and $S_1$ are spacers;

B and $B_1$ are endgroups which are susceptible to photopolymerisation or photocrosslinking;

M is a non-chromophoric aliphatic, alicyclic or aromatic moiety; and n is an integer from 1 to 10 wherein, when the value of n is greater than 1, each of the groups A, S and B may be the same or different, and wherein n optionally has a value of from 2to 6; and wherein said polymer network has a molecular weight of above 4,000, optionally in the range from 4,000 to 15,000 and optionally comprises from 5 to 50 monomeric units.

16. A polymer network of claim 15, wherein said polymer network comprises a light emitting electroluminescent polymer, a hole transporting polymer or an electron transporting polymer.

17. A polymer network of claim 15, wherein said material comprises at least one additional photopolymerisable or photocrosslinkable reactive mesogen, wherein said at least one additional photopolymerisable or photocrosslinkable reactive mesogen optionally has the formula (I):

$$B\text{-}S\text{-}A\text{-}S\text{-}B \qquad (I)$$

wherein:

A is a chromophore;

S is a spacer; and

B is an endgroup which is susceptible to photopolymerisation or photocrosslinking.

18. A device comprising a polymer layer formed from at least one polymer of claim 15.

19. A backlight or display comprising a charge transporting or light emitting polymer network as claimed in claim 15.

* * * * *